United States Patent
Ota

(10) Patent No.: US 11,545,531 B2
(45) Date of Patent: Jan. 3, 2023

(54) DISPLAY DEVICE COMPRISING A CONDUCTOR HAVING A WIDTH OF THE FIRST PORTION IN THE SECOND DIRECTION BEING GREATER THAN A WIDTH OF THE SECOND PORTION IN THE FIRST DIRECTION

(71) Applicant: SEIKO EPSON CORPORATION, Tokyo (JP)

(72) Inventor: Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 217 days.

(21) Appl. No.: 17/099,967

(22) Filed: Nov. 17, 2020

(65) Prior Publication Data
US 2021/0151534 A1 May 20, 2021

(30) Foreign Application Priority Data
Nov. 18, 2019 (JP) .............................. JP2019-207709

(51) Int. Cl.
| | |
|---|---|
| *H01L 29/08* | (2006.01) |
| *H01L 27/32* | (2006.01) |
| *H01L 51/52* | (2006.01) |
| *G09G 3/3266* | (2016.01) |
| *G09G 3/3291* | (2016.01) |

(52) U.S. Cl.
CPC ....... *H01L 27/3258* (2013.01); *G09G 3/3266* (2013.01); *G09G 3/3291* (2013.01); *H01L 27/3246* (2013.01); *H01L 51/5206* (2013.01); *H01L 51/5234* (2013.01); *H01L 2251/558* (2013.01)

(58) Field of Classification Search
CPC ............. H01L 27/3258; H01L 27/3246; H01L 51/5206; H01L 51/5234; H01L 2251/558
USPC ........................................................ 257/40
See application file for complete search history.

(56) References Cited

U.S. PATENT DOCUMENTS

| | | |
|---|---|---|
| 2007/0120473 A1 | 5/2007 | Nakamura et al. |
| 2007/0120779 A1 | 5/2007 | Nakamura et al. |
| 2007/0146245 A1 | 6/2007 | Goden et al. |

(Continued)

FOREIGN PATENT DOCUMENTS

| | | |
|---|---|---|
| JP | 2007-108453 A | 4/2007 |
| JP | 2007-139966 A | 6/2007 |

(Continued)

*Primary Examiner* — Phuc T Dang
(74) *Attorney, Agent, or Firm* — Oliff PLC

(57) ABSTRACT

A display device includes a substrate having a first side and a second side, a display region having a light-emitting element that includes an electrode, a pixel electrode disposed between the substrate and the electrode in a thickness direction of the substrate, and a light-emitting function layer disposed between the pixel electrode and the electrode in the thickness direction, a drive circuit disposed between the first side and the display region in plan view, and a conductive layer having a first portion extending between the first side and the display region in plan view and along the first direction, and a second portion extending between the second side and the display region in plan view and along the second direction, wherein a width of the first portion in the second direction is greater than a width of the second portion in the first direction.

11 Claims, 11 Drawing Sheets

(56) References Cited

U.S. PATENT DOCUMENTS

| | | |
|---|---|---|
| 2010/0141117 A1 | 6/2010 | Maru |
| 2015/0102323 A1 | 4/2015 | Koshihara et al. |
| 2017/0237033 A1* | 8/2017 | Koshihara ............ H01L 27/3276 257/88 |
| 2018/0301517 A1* | 10/2018 | Kokame ................ H01L 27/323 |
| 2019/0041915 A1* | 2/2019 | Park .................... H01L 27/3276 |
| 2019/0273122 A1 | 9/2019 | Iwasaki et al. |
| 2020/0295091 A1 | 9/2020 | Iwasaki et al. |

FOREIGN PATENT DOCUMENTS

| | | |
|---|---|---|
| JP | 2007-139967 A | 6/2007 |
| JP | 2007-164162 A | 6/2007 |
| JP | 2009-277985 A | 11/2009 |
| JP | 2010-139640 A | 6/2010 |
| JP | 2010-145661 A | 7/2010 |
| JP | 2015-76299 A | 4/2015 |
| JP | 2016-143605 A | 8/2016 |
| JP | 2018-200361 A | 12/2018 |
| JP | 2019-153411 A | 9/2019 |

* cited by examiner

DISPLAY DEVICE COMPRISING A CONDUCTOR HAVING A WIDTH OF THE FIRST PORTION IN THE SECOND DIRECTION BEING GREATER THAN A WIDTH OF THE SECOND PORTION IN THE FIRST DIRECTION

The present application is based on, and claims priority from JP Application Serial Number 2019-207709, filed Nov. 18, 2019, the disclosure of which is hereby incorporated by reference herein in its entirety.

BACKGROUND

1. Technical Field

The present disclosure relates to a display device and an electronic apparatus.

2. Related Art

In recent years, a display device using, for example, an Organic Light Emitting Diode (OLED) as a light-emitting element is known. In this type of display device, the demand for miniaturization and high definition is strong, thus, a configuration in which a light-emitting element and a drive circuit are integrally formed on a semiconductor substrate may be adopted. The OLED has a configuration in which a light-emitting function layer is interposed between a pixel electrode and a common electrode, and light emitted by the light-emitting function layer passes through, for example, a common electrode and is emitted outward. The common electrode is common to a plurality of ° LEDs, is electrically coupled to the terminal portion of the semiconductor substrate, and is applied with a predetermined voltage.

In this configuration, miniaturization is facilitated, but display unevenness is likely to occur due to local concentration of current flowing in the common electrode. Therefore, in order to reduce the wiring resistance of the common electrode, a technique has been proposed in which the resistance value per unit length of wiring on the side where the amount of current is greatest is set smaller than the resistance value of the wiring on the other side (for example, see JP-A-2009-277985).

However, in the technique described above, when the wiring width is widened in order to reduce the resistance value per unit length of wiring, the area of the semiconductor substrate may be consumed and miniaturization may be inhibited.

SUMMARY

A display device according to an aspect of the present disclosure includes a display region including a pixel circuit disposed at an intersection of a scanning line and a data line, a data line drive circuit configured to supply a data signal to the data line, an opening defining layer that is disposed between a conductive layer and a common electrode and that has insulating properties, wherein the pixel circuit includes a light-emitting element provided with a light-emitting function layer between a pixel electrode and the common electrode, the light-emitting element emits light based on the data signal when the scanning line is selected, the opening defining layer includes an opening portion outside the display region in plan view, a portion of the opening portion along one side overlaps with the data line drive circuit in plan view, and a width of a portion along the one side is greater than a width of a portion along another side, and the common electrode is electrically coupled to the conductive layer at the opening portion.

DESCRIPTION OF EXEMPLARY EMBODIMENTS

Display devices according to embodiments of the present disclosure are described below with reference to the accompanying drawings. Note that, in each figure, a size and a scale of each unit is different from the actual size and the actual scale of each unit as appropriate. Moreover, embodiments described below are suitable specific examples, and various technically preferable limitations are applied, but the scope of the disclosure is not limited to these modes unless it is specifically described in the following description to limit the present disclosure.

First Embodiment

Figure 1:
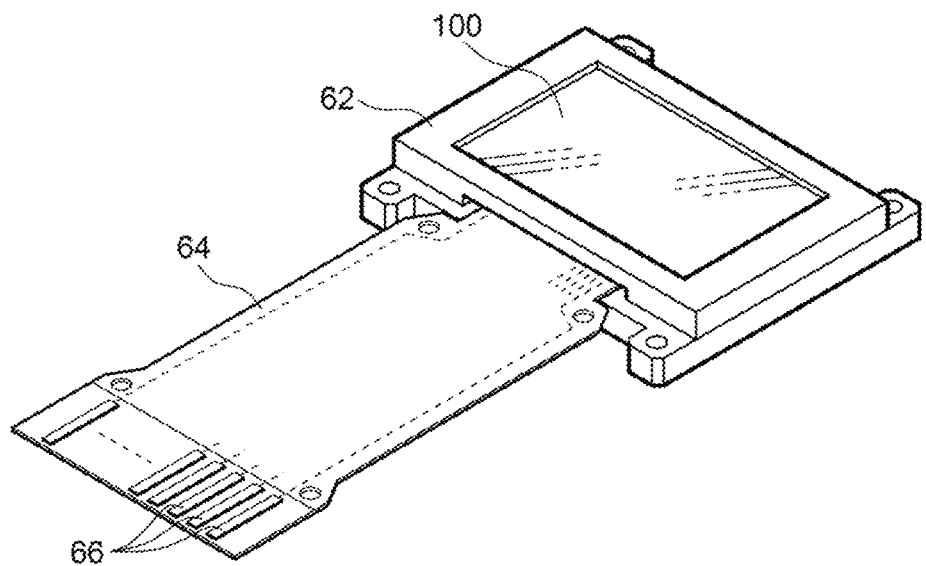
FIG. 1 is a perspective view illustrating a configuration of a display device 1 according to a first embodiment.
Figure 2:
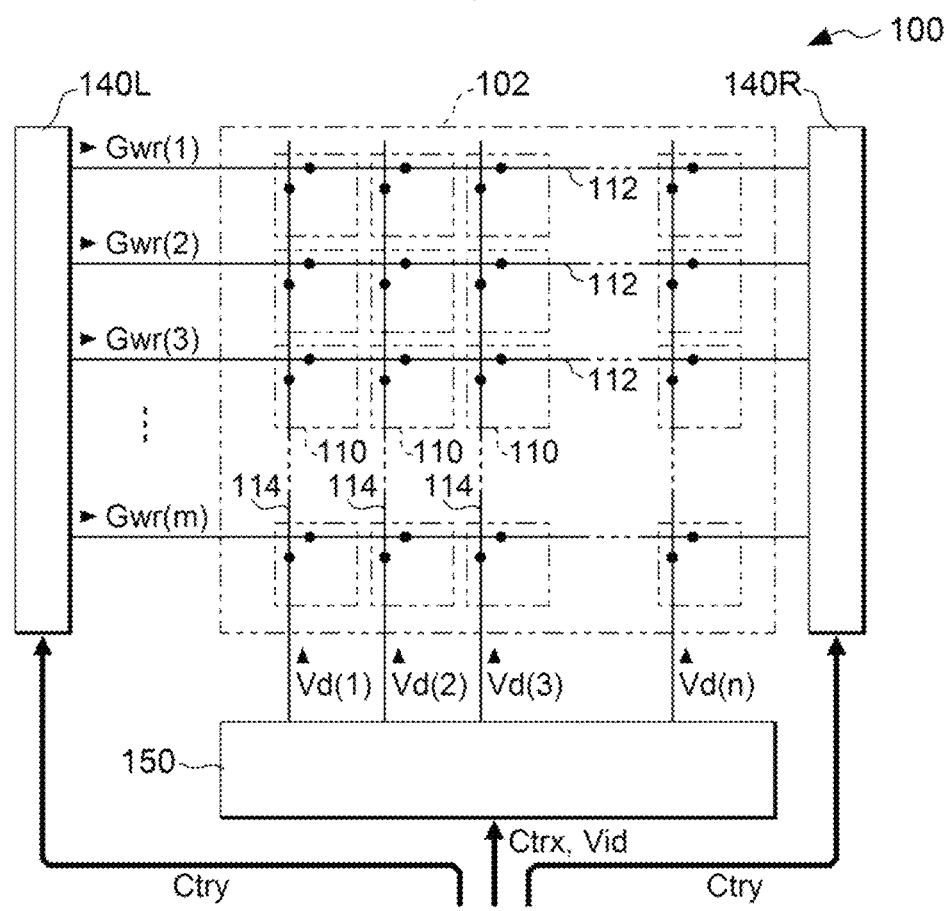
FIG. 2 is a block diagram illustrating a configuration of the display device.

FIG. 1 is a perspective view illustrating a configuration of a display device 100 according to a first embodiment, and FIG. 2 is a block diagram illustrating a configuration of the display device 100.

For example, the display device 100 is a micro display panel configured to display a color image in a Head-Mounted Display (HMD), and a plurality of pixel circuits, a drive circuit configured to drive the pixel circuits, and the like are formed on a semiconductor substrate. The semiconductor substrate is typically a silicon substrate, but may be semiconductor substrate made of the other materials.

The display device 100 is housed in a frame-shaped case 62 opened at a display region, and is coupled with one end of a Flexible Printed Circuits (FPC) substrate 64. A plurality of terminals 66 are provided on the other end of the FPC substrate 64, an upper device such as a host device and a timing controller is connected to the other end of the FPC substrate 64, and image data, synchronization signal, control signal, and the like are supplied via the plurality of terminals 66.

As illustrated in FIG. 2, the display device 100 includes a display region 102, a scanning line drive circuit 140L, 140R, and a data line drive circuit 150.

In the display region 102, m rows of scanning lines 112 are disposed in a left-right direction in the drawing, and n columns of data lines 114 are disposed so as to be electrically insulated from each of the scanning lines 112 along a vertical direction. The pixel circuits 110 are arranged in a matrix of m rows and n columns corresponding to each intersection of the m rows of scanning lines 112 and the n columns of data lines 114 in the display region 102.

Note that, m and n is integers not less than 2. In order to distinguish the rows of the scanning lines 112 and the rows of the matrix of the pixel circuits 110 for convenience, the rows may be referred as 1st, 2nd, 3rd, . . . , m-th row in order from the top in the drawing. When a row is generally described without identifying a row, the row is referred as an i-th row, by using i that satisfies $1 \leq i \leq m$.

Similarly, in order to distinguish the columns of the data lines 114 and the columns of the matrix of the pixel circuits 110 for convenience, the columns may be referred as 1st, 2nd, 3rd, . . . , n-th column in order from the left in the drawing. Further, when a column is generally described without identifying a column, the column is referred as a j-th column, by using j that satisfies $1 \leq j \leq n$.

A peripheral circuit configured to drive the pixel circuit 110 is provided around the display region 102. In the first embodiment, the peripheral circuit includes the scanning line drive circuit 140L, 140R and the data line drive circuit 150.

The scanning line drive circuit 140L is provided to the left of the display region 102 in the drawing. The scanning line drive circuit 140L generates scanning signals for each row according to a control signal Ctry supplied from the upper device, and supplies the scanning signals Gwr (1), Gwr (2), Gwr (3), . . . , Gwr (m) to the scanning lines 112 in the 1st, 2nd, 3rd, . . . , m-th row. The scanning line drive circuit 140R is provided to the right of the display region 102 in the drawing. The scanning line drive circuit 140R generates scanning signals according to the control signal Ctry and supplies the scanning signals Gwr (1), Gwr (2), Gwr (3), . . . , Gwr (m) to the scanning lines 112 in the 1st, 2nd, 3rd, . . . , m-th row. In other words, the scanning line drive circuit 140L and the scanning line drive circuit 140R supply the same scanning signals Gwr (1), Gwr (2), Gwr (3), . . . , Gwr (m).

In this way, the scanning signal is supplied to the scanning line 112 from the left and right sides of the display region 102, as compared to a configuration in which the scanning signal is supplied from either the left side or the right side of the display region 102.

The data line drive circuit 150 supplies data signals Vd (1) to Vd (n) of voltages corresponding to gray scale levels to the data lines 114 in the 1st column to the n-th column according to the control signals supplied from the upper device.

For convenience of explanation, the data lines 114 are divided into the following series. Specifically, the data lines 114 in the 1st, 4th, 7th, . . . , (n−2)th column are set as a first series, the data lines 114 in the 2nd, 5th, 8th, . . . , (n−1)th column are set as a second series, and the data lines 114 in the 3rd, 6th, 9th, . . . , n-th column are set as a third series.

In the present embodiment, the data line drive circuit 150 divides one horizontal scanning period into three, and distributes and supplies the data signals to the data lines 114 of the first series in the first period, the data lines 114 of the second series in the second period, and the data lines 114 of the third series in the third period.

Note that, in FIG. 2, the pixel circuit 110 is omitted because it is not directly related to the driving of the pixel circuit 110, but the peripheral circuit includes the inspection circuit 160.

Figure 3:
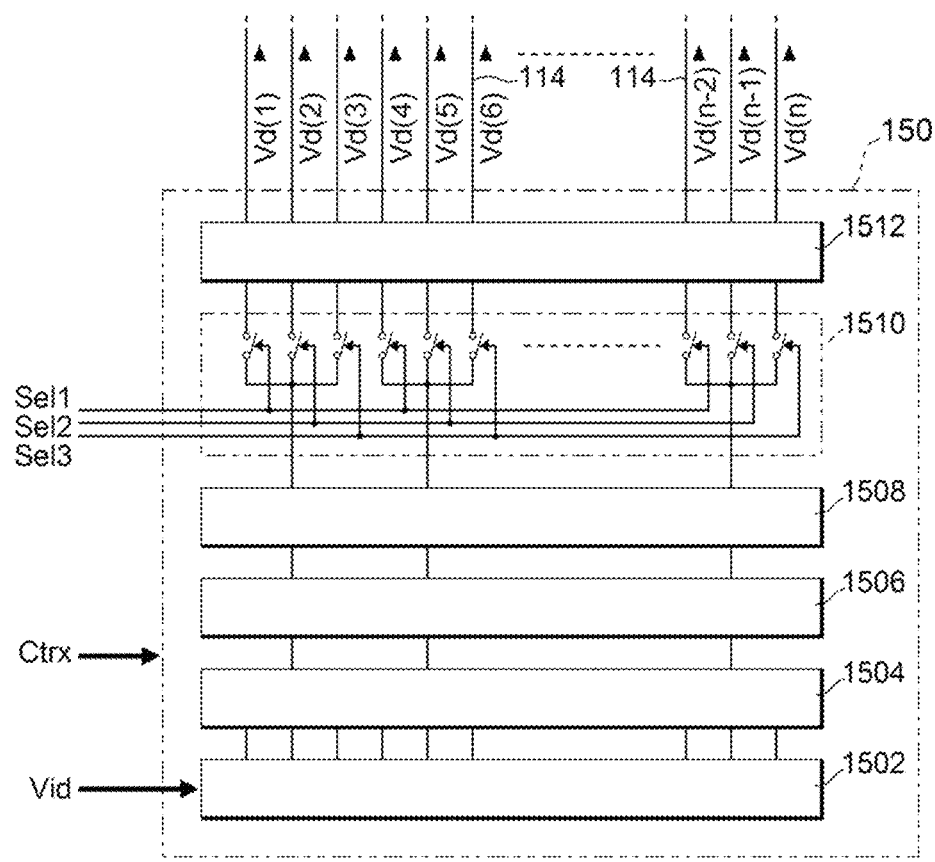
FIG. 3 is a block diagram of a data line drive circuit in the display device.

FIG. 3 is a block diagram illustrating an example of the data line drive circuit 150.

As illustrated in FIG. 3, the data line drive circuit 150 includes a shift register 1502, a data latch circuit 1504, a line latch circuit 1506, a DAC group 1508, a demultiplexer 1510, and an amplifier group 1512.

The shift register 1502 sequentially transfers image data Vid supplied from the upper device to each of the pixel circuits 110 and latches the image data Vid for one row, according to the vertical scanning and the horizontal scanning based on a control signal Ctrx.

The data latch circuit 1504 simultaneously latches the image data Vid for one row latched by the shift register 1502 before the start of the horizontal scanning.

The line latch circuit 1506 latches the image data Vid latched by the data latch circuit 1504 to match the selection of the demultiplexer 1510.

The DAC group 1508 is a collection of Digital to Analog Converters (DACs) configured to convert the image data Vid latched by the line latch circuit 1506 into an analog signal.

The demultiplexer 1510 includes switches corresponding to the data lines 114 between the DAC group 1508 and the amplifier group 1512, and each of the switches is controlled to be turned on or off according to any one of control signals Sel1 to Sel3. Specifically, in the demultiplexer 1510, switches corresponding to the data lines 114 of the first series are turned on or off by the control signal Sel1, switches corresponding to the data lines 114 of the second series are turned on or off by the control signal Sel2, switches corresponding to the data lines 114 of the third series are turned on or off by the control signal Sel3.

The amplifier group 1512 converts the voltage of the signal supplied via the demultiplexer 1510 and supplies the signal as a data signal to the data line 114.

Figure 4:
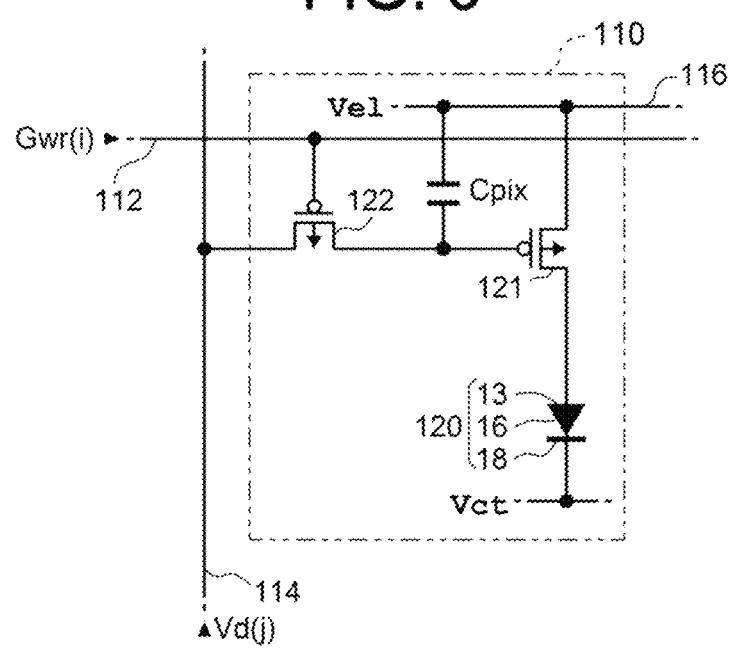
FIG. 4 is a diagram illustrating a configuration of a pixel circuit and the like in the display device.
Figure 5:
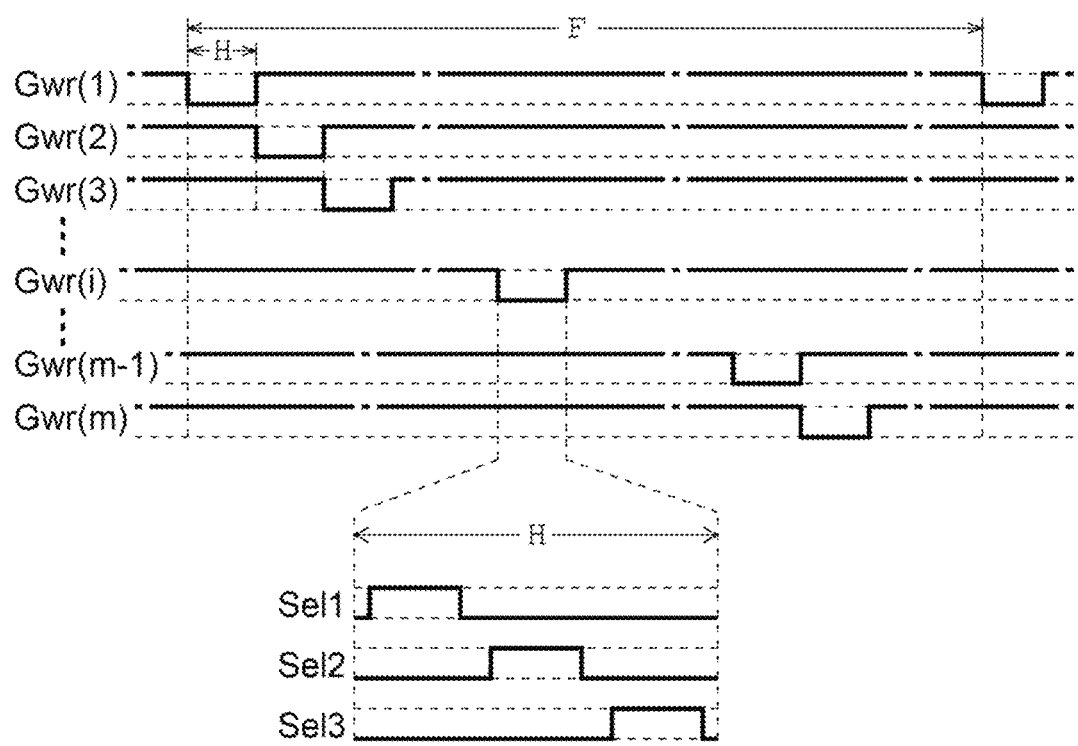
FIG. 5 is a diagram illustrating the operation of the display device.

FIG. 4 is a diagram illustrating a configuration of the pixel circuit 110 and the like. Note that, the pixel circuits 110 arranged in m rows and n columns have the same configuration electrically. Thus, the pixel circuit 110 will be described as being represented by that pixel circuit in the i-th row j-th column.

In FIG. 4, the pixel circuit 110 in the i-th row j-th column provided corresponding to the intersection between the scanning line 112 in the i-th row and the data line 114 in the j-th column includes OLED 120, p-channel type transistors 121 and 122, and a capacitive element Cpix.

In the pixel circuit 110, OLED 120 is an example of a light-emitting element, and is an element in which a light-emitting function layer 16 is interposed between a pixel electrode 13 and a common electrode 18. In the present embodiment, the pixel electrode 13 functions as an anode, and the common electrode 18 functions as a cathode. Furthermore, the common electrode 18 has optical transparency. In the OLED 120, when a current flows from the anode to the cathode, holes injected from the anode and electrons injected from the cathode are recombined in the light-emitting function layer 16 to generate excitons and generate white light. The white light generated at this time is resonant by an optical resonator (not illustrated) constituted by a reflective film and a half mirror, and emits at a resonant wavelength set according to any color of RGB. A color filter corresponding to the color is disposed on the emission side of the light from the optical resonator. Thus, the emitted light from the OLED 120 is visually recognized by an observer after being colored by the optical resonator and the color filter.

The OLED 120 provided in the pixel circuit 110 serves as the smallest unit of the display image. One pixel circuit 110 includes one OLED 120. The pixel circuit 110 is controlled independently of the other pixel circuits 110, and the OLED 120 emits light in a color corresponding to the pixel circuit 110 to represent one of the three primary colors.

That is, one pixel circuit 110 represents one of the three primary colors among colors to be displayed, thus, strictly speaking, one pixel circuit 110 should be referred to as a subpixel circuit, but it is referred to as a pixel circuit in order to simplify the explanation. Note that, the color filter is not provided in a configuration in which the display device 100 does not display a color, that is, a monochrome image of only contrast is displayed.

In the transistor 121 in the pixel circuit 110 in the i-th row j-th column, the gate node is connected to the drain node of the transistor 122 and one end of the capacitive element Cpix, the source node is connected to a power supply line 116 of the voltage Vel, and the drain node is connected to the pixel electrode 13 as the anode of the OLED 120.

The other end of the capacitive element Cpix is connected to the power supply line 116. Thus, the capacitive element Cpix holds the gate voltage in the transistor 121.

In the transistor 122 of the pixel circuit 110 in the i-th row j-th column, the gate node is connected to the scanning line 112 in the i-th row, and the source node is connected to the data line 114 in the j-th column. A voltage Vct is applied to the common electrode 18 as the cathode of the OLED 120.

Figure 10:
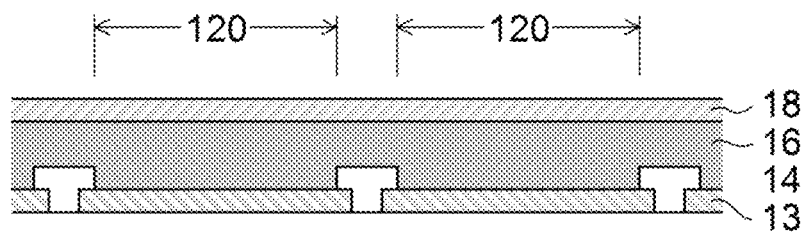
FIG. 10 is a partial cross-sectional view of a main part of the display device.

FIG. 10 is a diagram for explaining an operation of the display device 100. As illustrated in FIG. 10, the scanning signals Gwr (1) to Gwr (m) sequentially exclusively become L levels for each horizontal scan period (H) over a single vertical scan period (F). Here, the 1st row, the 2nd row, the 3rd row, . . . , the m-th row are scanned in this order, the scanning signals Gwr (1), Gwr (2), Gwr (3), . . . , Gwr (m) become L levels and the scanning line are selected.

Here, for example, in a single horizontal scanning period (H) in which the scanning line 112 in the i-th row is selected, the scanning signal Gwr (i) becomes L level, thus, for the pixel circuit 110 in the i-th row j-th column, the transistor 122 is turned on. Thus, the gate node of the transistor 121 is connected to the data line 114 in the j-th column.

In addition, in the horizontal scanning period (H), the control signals Sel1 to Sel3 exclusively become H level in this order. When the control signal Sel1 becomes the H level, the data line drive circuit 150 outputs a data signal of a pixel corresponding to the intersection between the scan line 112 in the i-th row and the data line 114 in the first series. For example, the data line drive circuit 150 outputs, to any one of the data lines 114 in the first series, a data signal of a pixel corresponding to the intersection between the scanning line 112 in the i-th row and the data line 114.

The data signal is applied to the gate node of the transistor 121 via the transistor 122 turned on in the pixel circuit 110 corresponding to the intersection, thus, the voltage of the data signal is held by the capacitive element Cpix, and the transistor 121 causes a current corresponding to the voltage between the gate and the source to flow in the OLED 120. This operation is performed in all of the pixel circuits 110 corresponding to the intersections of the scan line 112 in the i-th row and the data lines 114 of the first series.

Next, when the control signal Sel2 becomes H level, the data line drive circuit 150 outputs a data signal of a pixel corresponding to the intersection between the scan line 112 in the i-th row and the data line 114 in the second series. Thus, the operation in which the voltage of the data signal is held by the capacitive element Cpix, and the transistor 121 causes a current corresponding to the voltage between the gate and source to flow in the OLED 120 is performed in all of the pixel circuits 110 corresponding to the intersections of the scanning line 112 in the i-th row and the data lines 114 of the second series.

Subsequently, when the control signal Sel3 becomes H level, the data line drive circuit 150 outputs a data signal of a pixel corresponding to the intersection between the scan line 112 in the i-th row and the data line 114 of the third series. Thus, the operation in which the voltage of the data signal is held by the capacitive element Cpix, and the transistor 121 causes a current corresponding to the voltage between the gate and source to flow in the OLED 120 is performed in all of the pixel circuits 110 corresponding to the intersections of the scanning line 112 in the i-th row and the data lines 114 of the third series.

In this manner, in one horizontal scanning period (H) in which the i-th row is scanned, in n pixel circuits 110 corresponding to the scanning line 112 in the i-th row, the operation of holding the voltage of the data signal and causing the current corresponding to the held voltage to flow in the OLED 120 is performed in the order from the first series to the third series.

Note that, when the selection of the scanning line 112 in the i-th row ends and the scanning signal Gwr (i) becomes H level, and the voltage of the data signal is held by the capacitive element Cpix even when the transistor 122 is turned off, thus the current continues to flow in the OLED 120. Thus, in the pixel circuit 110 in the i-row j-th column, until one vertical scanning period (F) elapses, the transistor 122 is turned on again and a data signal is applied, the OLED 120 continues to emit light at a brightness corresponding to the voltage held by the capacitive element Cpix, that is, the gray scale level.

Furthermore, all of the pixel circuits 110 in the display device 100 emit light at a brightness specified at the gray scale level by scanning the rows other than the i-th row in the order of the 1st row, the 2nd row, the 3rd row, . . . , the m-th row. As a result, the image corresponding to the image data Vid is displayed by the display device 100.

Figure 6:
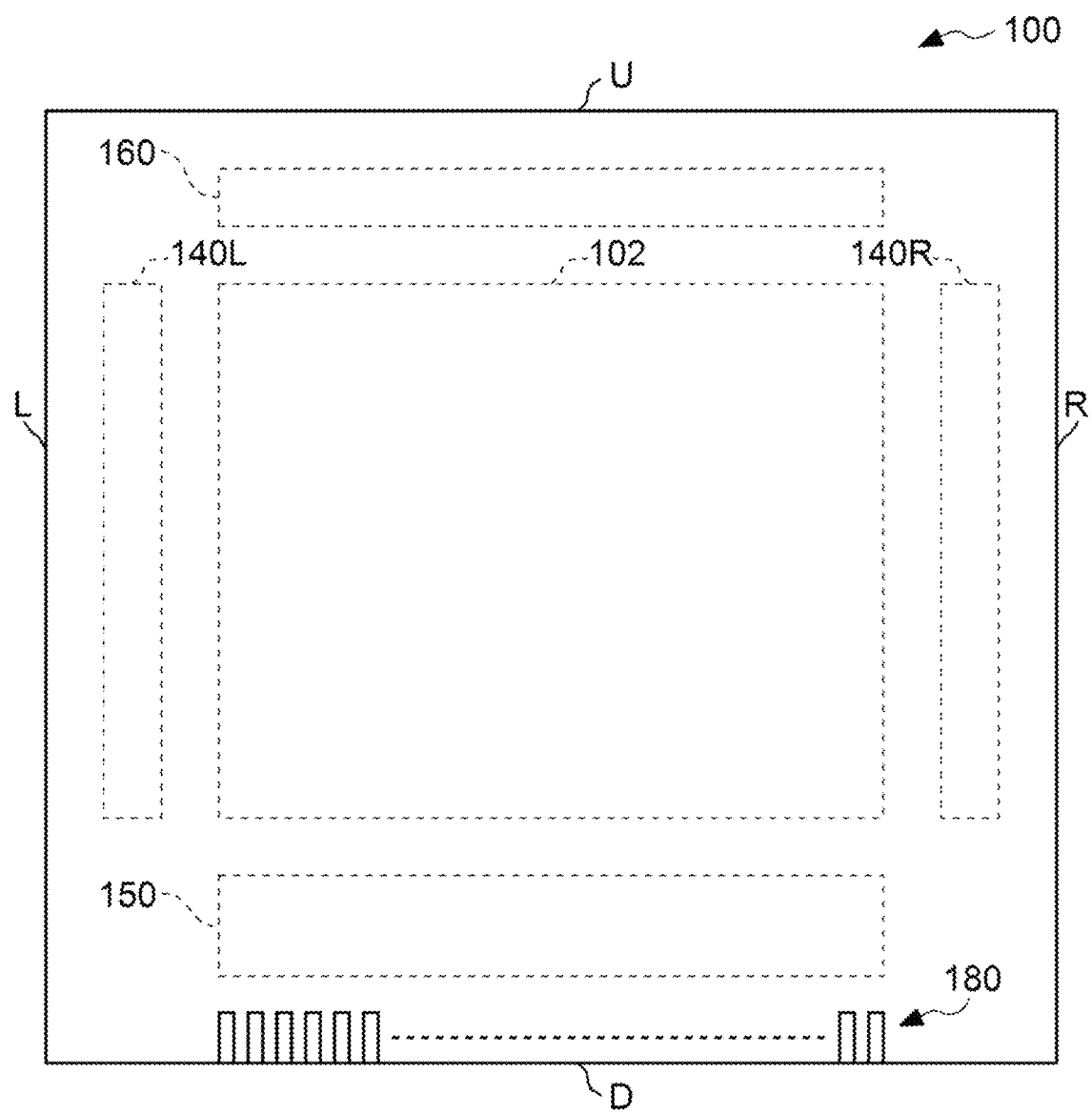
FIG. 6 is a diagram illustrating arrangement of elements in the display device.

FIG. 6 is a diagram illustrating the arrangement of each element in the display device 100.

Note that for convenience of the description, in the rectangular shaped display devices 100, the upper side is designated as "U", the lower side is designated as "D", the left side is designated as "L", and the right side is designated as "R". In FIG. 6, an inspection circuit 160 is provided between the upper side U and the display region 102. The inspection circuit 160 is provided for inspecting the scanning line drive circuits 140L and 140R and the data line drive circuit 150 after manufacturing.

The scanning line drive circuit 140L is provided between the left side L and the display region 102, and the scanning line drive circuit 140R is provided between the right side R and the display region 102.

In addition, a plurality of terminals 180 are provided along the horizontal direction in the drawing on the lower side D. For the plurality of terminals 180, one end of the FPC substrate 64 (see FIG. 1) is connected to the plurality of terminals 180, and a control signal of the scanning drive circuits 140L and 140R and the data line drive circuit 150, an image data Vid, a synchronization signal, and various voltages are supplied from the higher device via the FPC substrate 64 to the plurality of terminals 180.

The data line drive circuit 15 is provided between the plurality of terminals 180 and the display region 102.

As described above, the OLED 120 is an element in which the light-emitting function layer 16 is interposed between the pixel electrode 13 of the anode and the common electrode 18 of the cathode. The pixel electrode 13, the light-emitting function layer 16, and the common electrode 18 are formed in this order.

In addition, the common electrode 18 is required to be transparent as described above, thus, Indium Tin Oxide (ITO), alloys of magnesium and silver, and the like are used. A voltage Vct is applied to the common electrode 18, and the common electrode 18 is common to all of the OLED 120.

The light-emitting function layer 16 formed before the common electrode 18 is electrically a semiconductor. Thus, the common electrode 18 is formed covering the light-emitting layer. On the other hand, the plurality of terminals 180 are formed by patterning a conductive layer having a low resistivity.

Therefore, it is important that the wiring resistance be reduced uniformly from a specific one or more terminals among the plurality of terminals 180 to the common electrode 18 formed in a layer different from the layer in which the terminal is formed.

The light-emitting function layer 16 is formed continuously across all of the pixel circuits 120, rather than being formed for each pixel circuit 110. As a result, a region where the pixel electrode 13 and the common electrode 18 overlap in plan view, that is, a region where current flows from the pixel electrode 13 toward the common electrode 18 functions as the OLED 120.

The light-emitting function layer 16 includes, for example, a display region 102, and is formed via a metal mask that opens in a region wider than that of the display region. As a result, the light-emitting function layer 16 has a lower positional accuracy of the film formation compared to the other layers, which may cause a manufacturing error.

As described above, the common electrode 18 needs to cover the light-emitting function layer 16, but it should be noted that the positional accuracy when forming the light-emitting function layer 16 is low.

Figure 7:
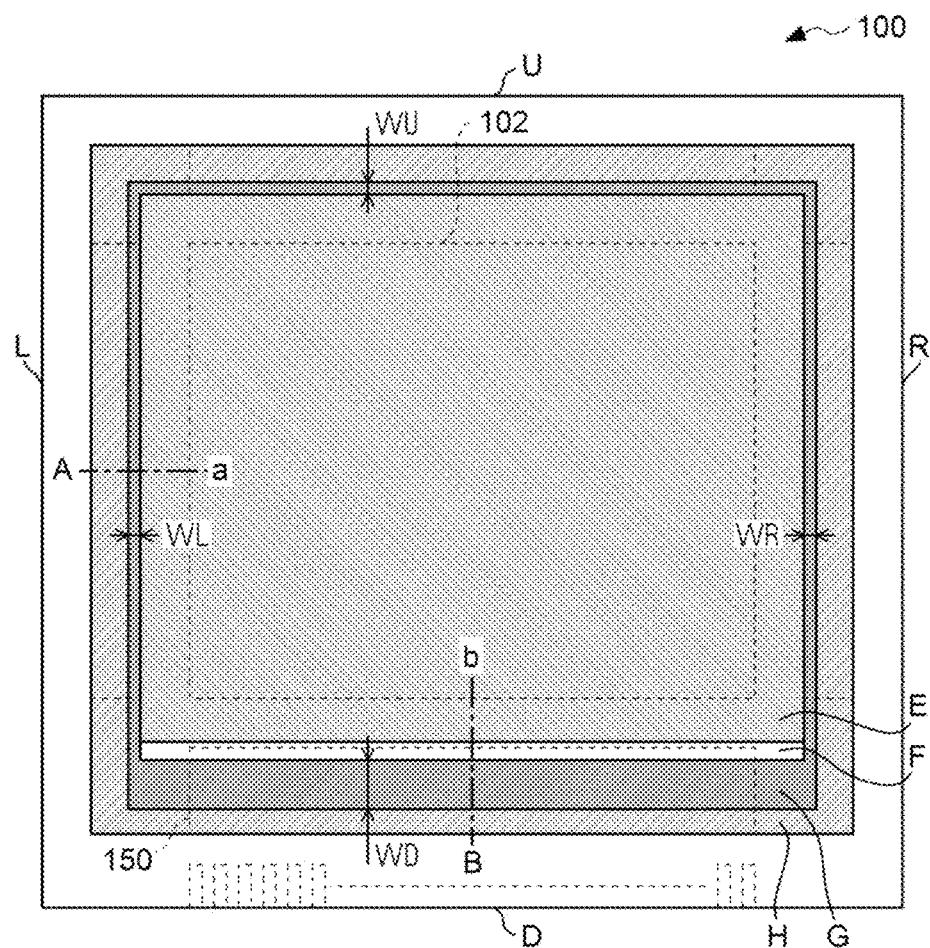
FIG. 7 is a diagram illustrating an arrangement of a light-emitting function layer, an opening portion of an opening defining layer, and a common electrode.
Figure 8:
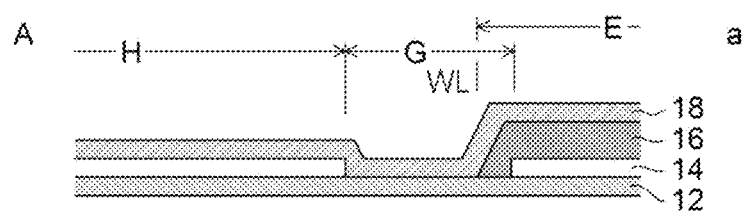
FIG. 8 is a partial cross-sectional view of a main part of the display device.
Figure 9:
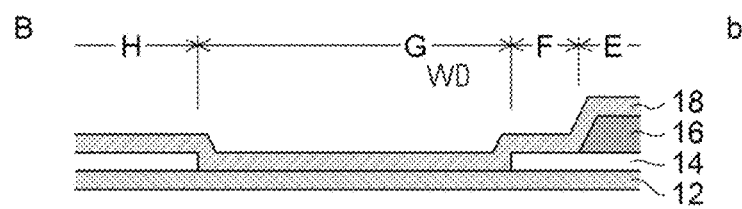
FIG. 9 is a partial cross-sectional view of a main part of the display device.

FIG. 7 is a plan view illustrating the arrangement of the light-emitting function layer 16, an opening portion of an opening defining layer, and the common electrode 18, FIG. 8 is a partial cross-sectional view taken along line A-a in FIG. 7, FIG. 9 is a partial cross-sectional view taken along line B-b in FIG. 7, and FIG. 10 is a main part cross-sectional view of the OLED 120 in the display device.

Note that, in the display device 100, a transistor or the like constituting a peripheral circuit or the like is formed, but in FIG. 8 to FIG. 10, the wiring layer, insulating layer, and the like that are lower than the pixel electrode 13, which is an anode, are omitted.

In FIG. 7, a region E is a region in which the light-emitting function layer 16 is provided in plan view, includes the display region 102, and is wider than the display region 102.

A region G is an opening portion outside the display region 102 among the opening portion of the opening defining layer 14 in plan view. The opening defining layer 14 is formed from an insulating inorganic material such as silicon nitride or silicon oxide, between the conductive layer 12 and the light-emitting function layer 16. Among the opening defining layer 14, the opening portion outside the display region 102 has a frame shape when viewed in plan view.

Thus, when the common electrode 18 is formed after the conductive layer 12 and the opening defining layer 14 are formed in this order, outside the display region 102, the conductive layer 12 and the common electrode 18 are electrically coupled to each other in the region G, which is the opening portion of the opening defining layer 14.

The conductive layer 12 is formed by patterning a metal layer, such as aluminum, and is formed in the same layer as a specific terminal among the plurality of terminals 180, or is formed in a different layer and is electrically coupled to a specific terminal. Thus, the voltage Vct is applied to the common electrode 18 via the specific terminal, the conductive layer 12, and the region G.

In the frame-shaped region G, a part of a portion along the lower side D overlaps the data line drive circuit 150 in plan view. Further, the distance from the display region 102 to the portion of the frame-shaped region G along the lower side D is greater than the distance from the display region 102 to a portion of the region G along the upper side U, the left side L, or the right side R.

Furthermore, in the regions G, the width WD of the portion along the lower side D (see FIG. 7 and FIG. 9) is greater than the width WL of the portion along the left side L (see FIG. 7 and FIG. 8). Note that, the width WD of the portion along the lower side D is not only greater than the width WL, but also greater than the width WU of the portion along the upper side U or the width WR of the portion along the right side R.

Note that in the present description, the distance from the display region 102 to a portion of the region G along one side refers to the shortest length among the lengths from any position of the edge edges of the display region 102 to any position of the inner edge of the one side. The width of the portion along a side refers to the length in the direction orthogonal to the side of the portion in plan view.

In addition, the region H refers to a region among the region, in which the common electrode 18 is formed, outer than the frame-shaped region G in plan view. In plan view, the region F is a region outside the display region 102 and inside the frame-shaped region G in plan view.

In the display region 102, as illustrated in FIG. 10, between the pixel electrode 13 and the light-emitting function layer, the opening defining layer 14 functions as an opening layer of the pixel electrode 13, that is, a layer defining the shape of the OLED 120 when viewed planarly. Further, the pixel electrode 13 may be formed by patterning the same layer as the conductive layer 12, or may be formed by patterning a layer different from the conductive layer 12.

As described above, the positional accuracy of the film formation in the light-emitting function layer 16 is low, thus, with reference to the opening defining layer 14, as illustrated in FIG. 8, the light-emitting function layer 16 may reach the edge of the opening defining layer 14, or as illustrated in FIG. 9, the light-emitting function layer 16 may not reach the edge of the opening defining layer 14.

In the region G, the portions of the region G along the upper side U, the left side L, and the right side R are close to the display region 102, when the light-emitting function layer 16 is displaced, as illustrated in FIG. 8, the light-emitting function layer 16 may reach the edge of the opening defining layer 14 and erode the opening defining layer 14, and the conductive distance between the conductive layer 12 and the common electrode 18 may be narrowed.

In contrast, the portion of the region G along the lower side D is farther from the display region 102, thus, even if the light-emitting function layer 16 is displaced, the opening portion of the opening defining layer 14 is not eroded due to the light-emitting function layer 16 does not reach the edge of the opening defining layer 14, as illustrated in FIG. 9.

As described above, the data line drive circuit 150 is formed with a shift register 1502, a data latch circuit 1504, a line latch circuit 1506, a DAC group 1508, and the like, thus, a large area is required compared to the scanning line drive circuits 140L and 140R. In the region G, the portion along the lower side D is provided in a region overlapping with the data line drive circuit 150 in plan view, and thus the width of the portion along the lower side D can be greater than the width of the portion along the upper side U, the left side L, or the right side R. Therefore, in the first embodiment, even if the positional accuracy of the film formation in the light-emitting function layer 16 is low, in the portion of the region G along the lower side D, the area of the region where the conductive layer 12 and the common electrode 18 are electrically coupled can be ensured in a large area, and therefore, the contact resistance can be reduced and the resistance of the common electrode 18 can be reduced.

Additionally, in the first embodiment, in order to ensure the area of the conduction region, it is not necessary to increase the area of the substrate, so it is possible to prevent the miniaturization and narrowing of the display device 100 from being inhibited.

Second Embodiment

Next, a display device 100 according to a second embodiment will be described.

The second embodiment has the same electrical configuration as the first embodiment, but differs from the first embodiment in that the locations where the plurality of terminals 180 are provided are different. Therefore, the second embodiment will be described focusing on this difference.

Figure 11:
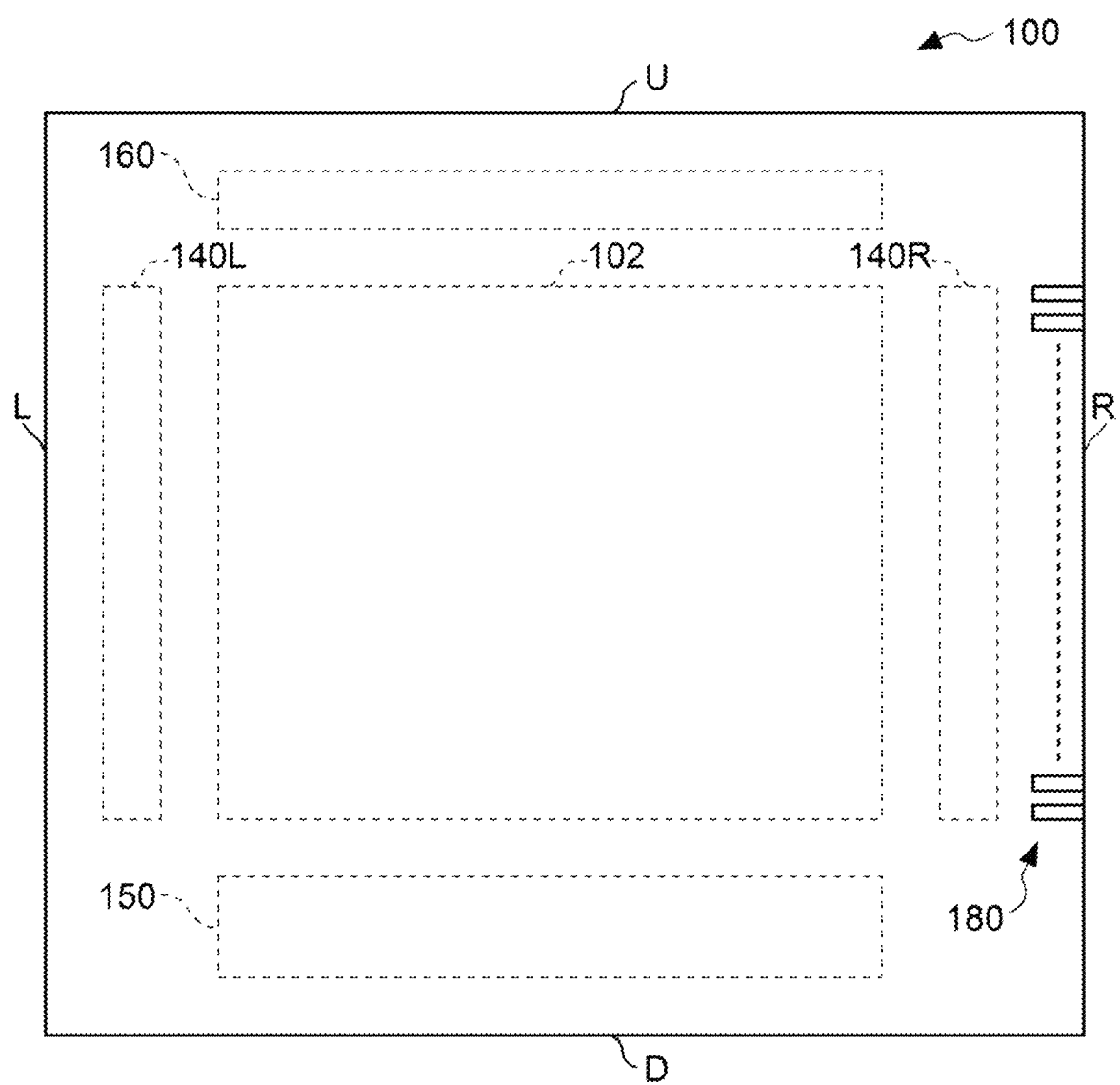
FIG. 11 is a diagram illustrating an arrangement of elements in a display device according to a second embodiment.

FIG. 11 is a diagram illustrating an arrangement of each element in the display device 100 according to the second embodiment.

As illustrated in FIG. 11, a plurality of terminals 180 are provided along the vertical direction in the drawing at the right side R.

Figure 12:
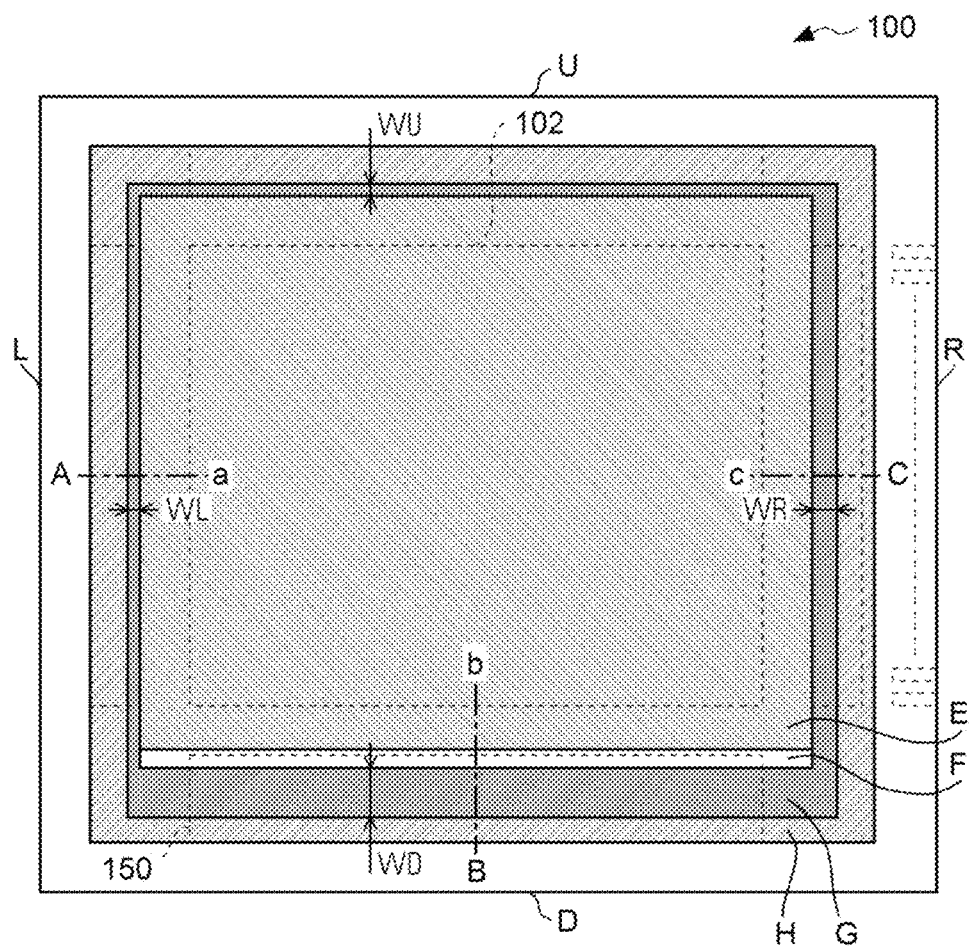
FIG. 12 is a diagram illustrating an arrangement of a light-emitting function layer, an opening portion of an opening defining layer, and a common electrode.
Figure 13:
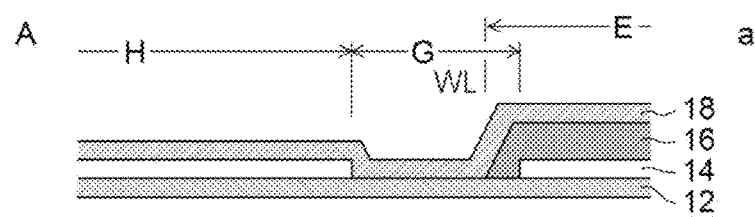
FIG. 13 is a block diagram illustrating a configuration of the display device.
Figure 14:
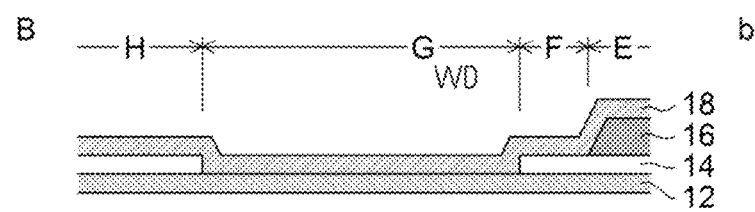
FIG. 14 is a block diagram illustrating a configuration of the display device.
Figure 15:
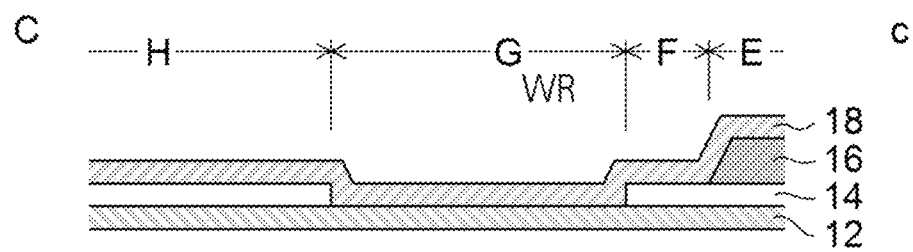
FIG. 15 is a block diagram illustrating a configuration of the display device.

FIG. 12 is a plan view illustrating the arrangement of the light-emitting function layer, the opening portion of the opening defining layer, and the common electrode, FIG. 13 is a partial cross-sectional view taken along line A-a in FIG. 12, FIG. 14 is a partial cross-sectional view taken along line B-b in FIG. 12, and FIG. 15 is a partial cross-sectional view taken along line C-c in FIG. 12.

As illustrated in these drawings, in the region G, the width WD of the portion along the lower side D, the width WR of the portion along the right side R, and the width WL of the portion along the left side L are widened in this order. That is, WD>WR>WL.

Note that, although omitted in the drawings, in the region G, the width of the portion along the upper side U is substantially the same as the width WL of the portion along the left side L.

In the second embodiment, even if the positional accuracy of the film formation in the light-emitting function layer 16 is low, in the region G, in addition to the portion along the lower side D, the area of the conductive region can be ensured for the portion along the lower side R as well. Thus, as a result the decrease in contact resistance in the conductive region, the resistance of the common electrode 18 can be reduced.

MODIFIED EXAMPLES, APPLICATIONS, AND THE LIKE

The above-described embodiments and the like can be applied or modified as follows.

First Modified Example

Figure 16:
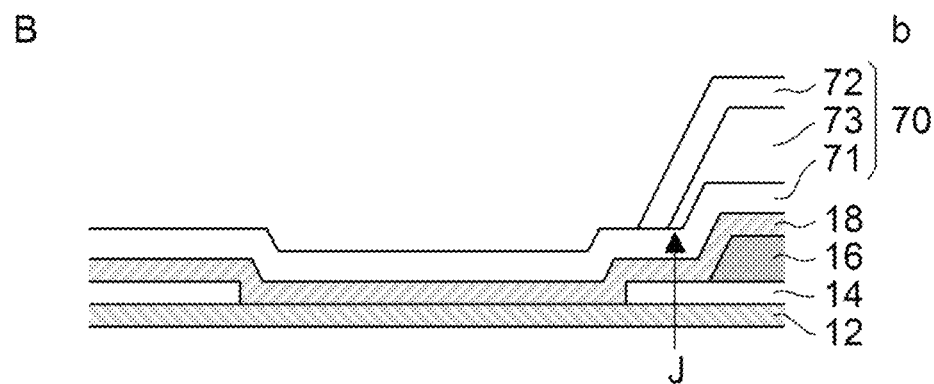
FIG. 16 is a partial cross-sectional view of a main part of a display device according to a first modified example.

When a sealing layer 70 is provided so as to cover the light-emitting function layer 16 in the display device 100, the position of the edge end of the constituent layer of the sealing layer 70 may be defined as described next. FIG. 16 corresponds to a partial cross-sectional view of a display device 100 according to the first modified example, taken along line B-b in FIG. 7. As illustrated in FIG. 16, the sealing layer 70 includes a first inorganic layer 71, an intermediate layer 73, and a second inorganic layer 72 in this order.

The first inorganic layer 71 of the sealing layer 70 is formed on the surface of the common electrode 18 and is in direct contact with the surface of the common electrode 18. The first inorganic layer 71 is formed across the entire area of the display device 100 including the display region 102. The first inorganic layer 71 is formed of an inorganic material having insulating properties and transparency such as a silicon compound (typically, silicon nitride or silicon oxide) in a film thickness of, for example, approximately 200 nm to 400 nm.

The intermediate layer 73 is an element that seals the light-emitting function layer 16, and is formed of an optically transparent organic material such as an epoxy resin. The edge end j of the intermediate layer 73 is outside the light-emitting function layer 16 in plan view, and is positioned further to the inside than the region G. The intermediate layer 73 also functions as a flattening film that fills the steps of the surface of the common electrode 18 and the first inorganic layer 71 in the display region 102. Therefore, the intermediate layer 73 is formed to have a sufficiently thick film thickness (for example, 1 μm to 5 μm, particularly preferably 3 μm) compared to the first inorganic layer 71 and the second inorganic layer 72. Note that the material of the intermediate layer 73 is not limited to organic materials.

The second inorganic layer 72 is an element that seals the intermediate layer 73. Therefore, the edge end of the second inorganic layer 72 is outside of the intermediate layer 73 in plan view, and is positioned further to the inside than the region G. The second inorganic layer 72 is an inorganic material having excellent water resistance and heat resistance, and is formed from an inorganic material having insulating properties and transparency to a film thickness of, for example, approximately 300 nm to approximately 700 nm (particularly preferably approximately 400 nm). For example, a nitrogen compound (silicon nitride, silicon oxide, silicon oxynitride) is suitable as a material for the second inorganic layer.

The film thickness of the intermediate layer 73 is thicker compared to the first inorganic layer 71 and the second inorganic layer 72, and therefore, the positional accuracy of the film formation in the intermediate layer 73 is low. However, according to the first modified example, when the edge end j of the intermediate layer 73 is outside of the light-emitting function layer 16 in plan view, the function of sealing the light-emitting function layer 16 can be ensured.

Second Modified Example

Figure 17:
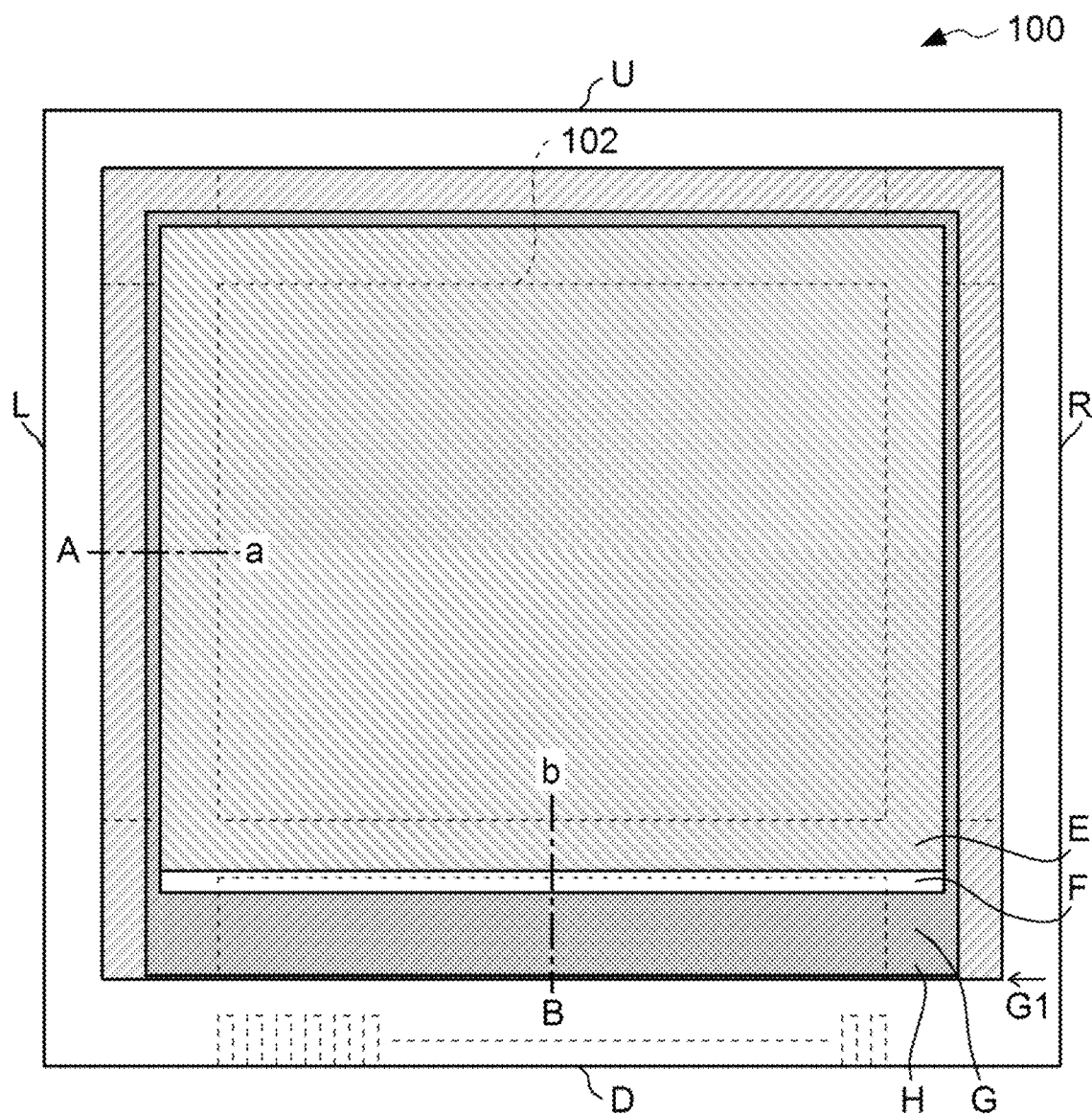
FIG. 17 is a diagram illustrating an arrangement of a light-emitting function layer, an opening portion of an opening defining layer, and a common electrode of a display device according to a second modified example.

FIG. 17 is a plan view illustrating an arrangement of a light-emitting function layer, an opening portion of an opening defining layer, and a common electrode of a display device 100 according to a second modified example. As illustrated in FIG. 17, in the opening portion (region G) of the opening defining layer 14, the side of the position farthest from the display region 102 can be enlarged to the edge end of the region where the conductive layer 12 and the common electrode 18 overlap in plan view.

Note that in FIG. 17, among portions along the upper side U, the lower side D, the left side L, and the right side R in the frame-shaped region G, the portion in the farthest position from the display region is a portion along the lower side D. Thus, in the opening portion of the opening defining layer 14, the side in the furthest position from the display region 102 is the lower side G1 in the drawing of the portion of the region G along the lower side D.

Third Modified Example

Figure 18:
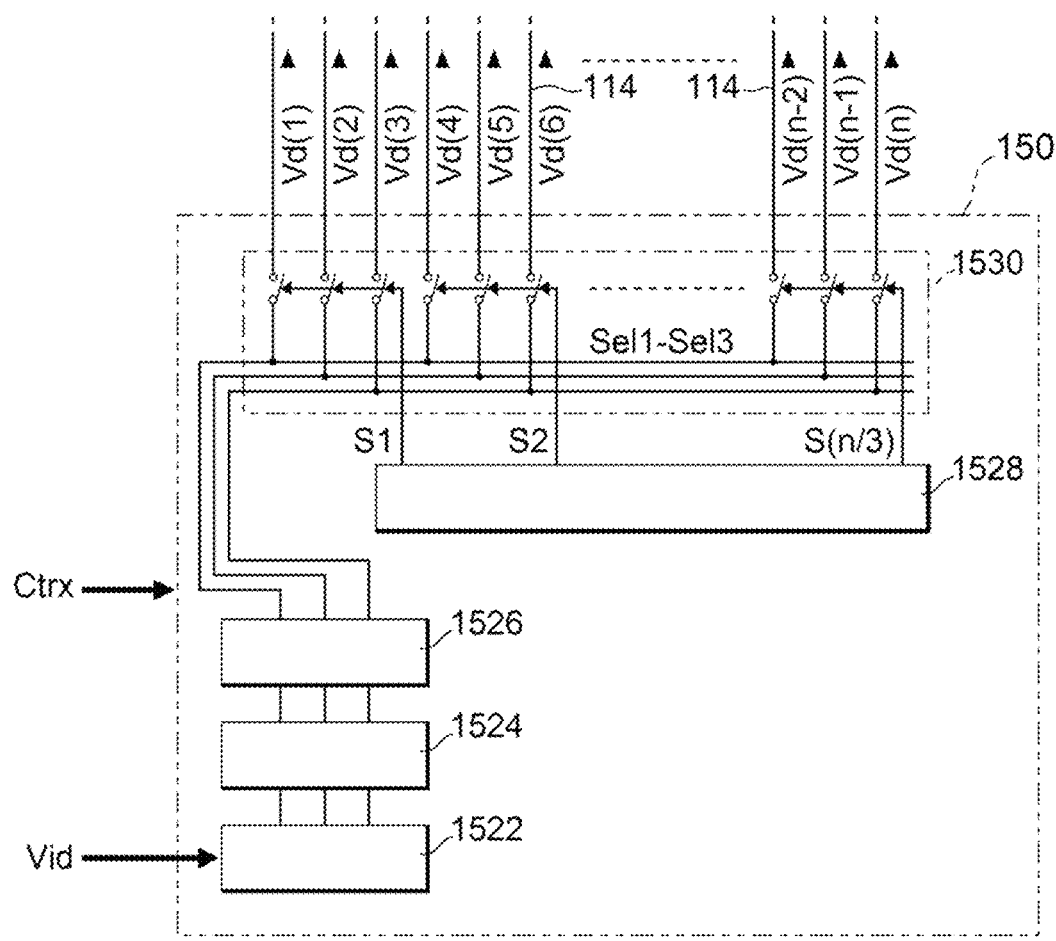
FIG. 18 is a block diagram of a data line drive circuit in the display device according to a third modified example.

The data line drive circuit 150 may be a serial to parallel conversion type as illustrated in FIG. 18, rather than a demultiplexer type.

Note that, the data line drive circuit 150 illustrated in FIG. 18 includes latch circuits 1522 and 1524, a DAC group 1526, a selection circuit 1528, and a switch group 1530.

The latch circuit 1522 sequentially transfers the image data Vid supplied from the upper device to each of the pixel circuits 110 and latches the image data Vid for one row.

The latch circuit 1524 simultaneously latches the image data Vid for one row latched by the latch circuit 1522 before the start of the horizontal scanning, and outputs the data corresponding to the selection by the selection circuit 1528 among the latched image data Vid.

The DAC group 1526 is a collection of DACs that convert data output from the latch circuit 1524 into analog signals.

The switch group 1530 includes a switch provided between the DAC group 1526 and the data line 114. In the switch group 1530, switches corresponding to the data lines 114 in the 1st column to the 3rd column, counted from the left, are turned on or off by a control signal S1, and switches corresponding to the data lines 114 in the 4th column to the 6th column are turned on or off by a control signal S2. Then, the switches corresponding to the data lines 114 in the (n−2)th column to the n-th column counted from the left are turned on or off by a control signal S(n/3).

The selection circuit 1528 outputs the control signals S1, S2, ..., S(n/3) so that, during one horizontal scanning period (H), the switches in the 1st column to the 3rd column, the switches in the 4th column to the 6th column, ..., the switches in the (n−2) th column to the n-th column are turned on sequentially and exclusively.

Note that, in addition to the elements illustrated in FIG. 3 or FIG. 18, the data line drive circuit 150 may include a lookup table that converts the gray scale level of the image data into an output level for the display device 100, a power supply circuit configured to generate various voltages, and the like.

If the data line drive circuit 150 has the configuration illustrated in FIG. 18, as in the case of FIG. 3, the scanning line drive circuits 140L and 140R are configured by a large number of elements, thus a large area is required for the data line drive circuit 150. However, in the region G that is the opening portion of the opening defining layer 14, the portion along the lower side is provided in the region overlapping the data line drive circuit 150 in plan view, thus, a large area of the conductive region between the conductive layer 12 and the common electrode 18 can be ensured.

Electronic Apparatus

Next, an electronic apparatus to which the display device 100 according to the embodiments and the like is applied will be described. The display device 100 is suitable for application with a small pixel and high definition display. In this regard, a head-mounted display will be described as an example of the electronic apparatus.

Figure 19:
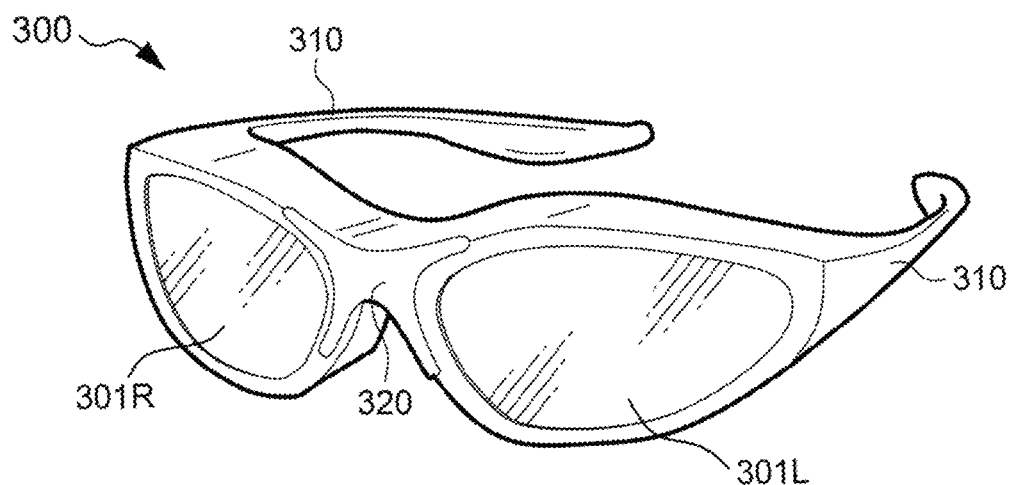
FIG. 19 is a perspective view of a head-mounted display using a display device according.
Figure 20:
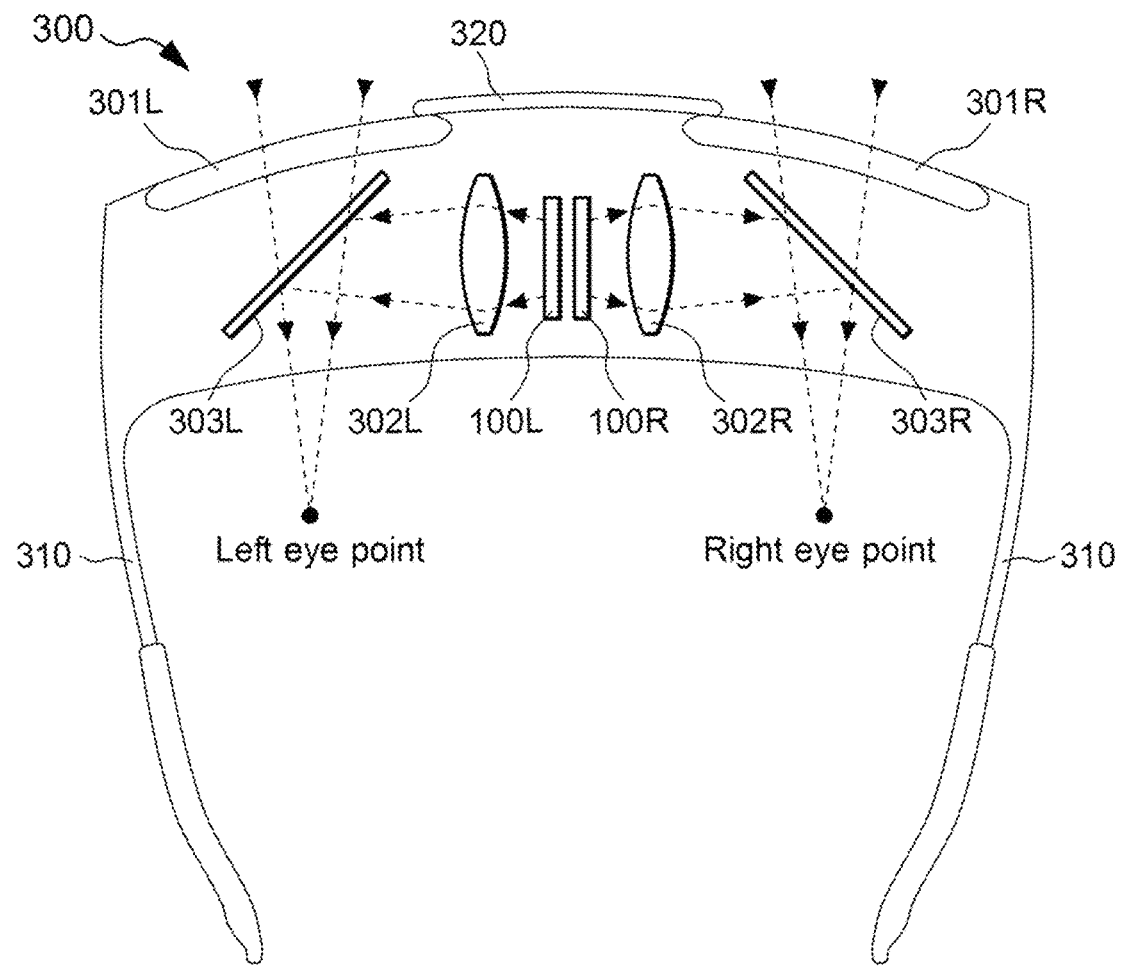
FIG. 20 is a diagram illustrating an optical configuration of the head-mounted display.

FIG. 19 is a view illustrating appearance of a head-mounted display, and FIG. 20 is a view illustrating an optical configuration of the head-mounted display.

As illustrated in FIG. 19, a head-mounted display 300 includes, in terms of appearance, temples 310, a bridge 320, and lenses 301L and 301R, as with typical eye glasses. In addition, as illustrated in FIG. 20, the head-mounted display 300 is provided with a display device 100L for a left eye and a display device 100R for a right eye in the vicinity of the bridge 320 and on the back side (the lower side in the drawing) of the lenses 301L and 301R.

An image display surface of the display device 100L is disposed to be on the left of FIG. 20. According to this configuration, a display image by the display device 100L is output via an optical lens 302L in a 9-o'clock direction in the drawing. A half mirror 303L reflects the display image by the display device 100L in a 6-o'clock direction, while the half mirror 303L transmits light entering in a 12-o'clock direction. An image display surface of the display device 100R is disposed on the right side opposite to the display device 100L. According to this configuration, a display image by the display device 100R is output via an optical lens 302R in a 3-o'clock direction in the drawing. A half mirror 303R reflects the display image by the display device 100R in a 6-o'clock direction, while the half the mirror 303R transmits light entering in a 12-o'clock direction.

In this configuration, a wearer of the head-mounted display 300 can observe the display images by the display devices 100L and 100R in a see-through state in which the display images by the display devices 100L and 100R overlap with the outside.

In addition, in the head-mounted display 300, of images for both eyes with parallax, an image for a left eye is displayed on the display device 100L, and an image for a right eye is displayed on the display device 100R, and thus, it is possible to cause a wearer to sense the displayed images as an image displayed having a depth or a three dimensional effect.

Note that, in addition to the head mount display 300, the electronic apparatus including the display device 100 can be applied to an electronic viewing finder in a video camera, a lens-exchangeable digital camera, or the like.

Note

A display device according to one aspect (Aspect 1) includes a display region including a pixel circuit provided at an intersection of a scanning line and a data line, a data line drive circuit configured to supply a data signal to the data line, and an opening defining layer that is provided between the conductive layer and the common electrode and that has insulating properties, wherein the pixel circuit includes a light-emitting element in which a light-emitting function layer is interposed between the pixel electrode and the common electrode, the light-emitting element emits light based on the data signal when the scanning line is selected, the opening defining layer has an opening portion outside the display region in plan view, and a portion of the opening portion along one side overlaps with the data line drive circuit in plan view, a width of the portion along the one side is wider than a width of a portion along another side, and the common electrode is electrically coupled to the conductive layer at the opening portion.

According to Aspect 1, the area of the region where the conductive layer and the common electrode are electrically coupled can be ensured in a large area, and therefore the contact resistance can be reduced and the resistance of the common electrode can be reduced. In addition, in order to ensure the area of the conduction region to be large, it is not necessary to increase the area of the substrate, and thus, the display device is prevented from the miniaturization and narrowing of the display device from being inhibited.

Note that, in the frame-shaped region G, a portion along the lower side D is an example of a portion along one side. In addition, in the frame-shaped region G, a portion along the left side L is an example of a portion along another side.

In a display device according to a specific aspect (Aspect 2) of Aspect 1, a distance from the display region to a portion along one side is greater than a distance from the display region to a portion along another side.

According to Aspect 2, even if the positional accuracy of the film formation in the light-emitting function layer is low, the area of the region where the conductive layer and the common electrode are electrically coupled can be ensured in a large area.

In a display device according to a specific aspect (Aspect 3) of Aspect 1 or Aspect 2, the light-emitting function layer is covered by a common electrode. According to Aspect 3, the light-emitting function layer is covered by a common electrode, thus the common electrode functions as a type of seal.

A display device according to a specific aspect (Aspect 4) of Aspect 3 includes a sealing layer covering the light-emitting function layer and the common electrode, wherein the sealing layer includes a first inorganic layer, an intermediate layer, and a second inorganic layer. According to Aspect 4, the light-emitting function layer is covered with the sealing layer configured by three layers, and thus, the ingress of external air or moisture into the light-emitting function layer is prevented.

An electronic apparatus according to a specific aspect (Aspect 5) of Aspects 1 to 4 includes the display device according to any one of the above-described aspects. According to Aspect 5, miniaturization and narrowing of the display device can be facilitated, thus miniaturization of the electronic device can be also facilitated.

What is claimed is:

1. A display device comprising:
   a substrate having a first side extending in a first direction and a second side extending in a second direction intersecting the first direction;
   a display region having a light-emitting element that includes an electrode, a pixel electrode disposed between the substrate and the electrode in a thickness direction of the substrate, and a light-emitting function layer disposed between the pixel electrode and the electrode in the thickness direction;
   a drive circuit disposed between the first side and the display region in plan view; and
   a conductive layer having:
      a first portion extending between the first side and the display region in plan view and along the first direction, the first portion being in contact with the electrode; and
      a second portion extending between the second side and the display region in plan view and along the second direction, the second portion being in contact with the electrode, wherein
   a width of the first portion in the second direction is greater than a width of the second portion in the first direction.

2. The display device according to claim 1, further comprising:
   an insulating layer that is arranged between the conductive layer and the electrode in the thickness direction, and that includes a first opening portion overlapping with the first portion in plan view and a second opening portion overlapping with the second portion in plan view, wherein
   a width of the first opening portion in the second direction is greater than a width of the second opening portion in the first direction.

3. The display device according to claim 1, wherein
   a distance from the display region to the first portion is greater than a distance from the display region to the second portion.

4. The display device according to claim 2, wherein
   a distance from the display region to the first portion is greater than a distance from the display region to the second portion.

5. The display device according to claim 1, wherein
   the light-emitting function layer is covered by the electrode in plan view.

6. The display device according to claim 5, further comprising:
   a sealing layer covering the electrode in plan view, wherein
   the sealing layer includes a first inorganic layer, an intermediate layer, and a second inorganic layer.

7. A display device comprising:
   a substrate including a first side and a second side intersecting the first side;
   a display region including a pixel circuit disposed at an intersection of a scanning line and a data line;
   a data line drive circuit configured to supply a data signal to the data line; and
   an opening defining layer that is disposed between a conductive layer and a common electrode and that has insulating properties, wherein the pixel circuit includes a light-emitting element including a light-emitting function layer between a pixel electrode and the common electrode, the light-emitting element emits light based on the data signal when the scanning line is selected, the opening defining layer includes an opening portion outside the display region in plan view, a portion of the opening portion along the first side overlaps with the data line drive circuit in plan view, and a width of the portion along the first side is greater than a width of a portion along the second side, and the common electrode is electrically coupled to the conductive layer at the opening portion.

8. The display device according to claim 7, wherein a distance from the display region to the portion along the first side is greater than a distance from the display region to the portion along the second side.

9. The display device according to claim 7, wherein the light-emitting function layer is covered by the common electrode.

10. The display device according to claim 9, comprising:

a sealing layer covering the light-emitting function layer and the common electrode, wherein the sealing layer includes a first inorganic layer, an intermediate layer, and a second inorganic layer.

11. An electronic apparatus comprising:

the display device according to claim 1.

\* \* \* \* \*